(12) United States Patent
Lin et al.

(10) Patent No.: US 11,646,270 B2
(45) Date of Patent: *May 9, 2023

(54) MULTI-CHIP PACKAGE AND MANUFACTURING METHOD THEREOF

(71) Applicant: Industrial Technology Research Institute, Hsinchu (TW)

(72) Inventors: Ang-Ying Lin, Tainan (TW); Yu-Min Lin, Hsinchu County (TW); Shin-Yi Huang, Hsinchu County (TW); Sheng-Tsai Wu, Taoyuan (TW); Yuan-Yin Lo, Kaohsiung (TW); Tzu-Hsuan Ni, Hsinchu (TW); Chao-Jung Chen, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 256 days.

This patent is subject to a terminal disclaimer.

(21) Appl. No.: 17/065,521

(22) Filed: Oct. 8, 2020

(65) Prior Publication Data

US 2021/0111126 A1 Apr. 15, 2021

Related U.S. Application Data

(60) Provisional application No. 62/912,651, filed on Oct. 9, 2019.

(30) Foreign Application Priority Data

Sep. 10, 2020 (TW) .................. 109131057

(51) Int. Cl.
  *H01L 23/538* (2006.01)
  *H01L 21/48* (2006.01)
  (Continued)

(52) U.S. Cl.
  CPC ........ *H01L 23/5386* (2013.01); *H01L 21/481* (2013.01); *H01L 21/486* (2013.01);
  (Continued)

(58) Field of Classification Search
  CPC ............... H01L 23/5386; H01L 21/481; H01L 21/4857; H01L 21/486; H01L 23/5383;
  (Continued)

(56) References Cited

U.S. PATENT DOCUMENTS 9,190,380 B2  11/2015  Teh et al.
9,824,902 B1  11/2017  Hou et al.
(Continued)

FOREIGN PATENT DOCUMENTS

CN  108028225  5/2018
CN  110323197  10/2019
(Continued)

OTHER PUBLICATIONS

"Office Action of Taiwan Counterpart Application", dated Feb. 26, 2021, p. 1-p. 6.

*Primary Examiner* — Jasmine J Clark
(74) *Attorney, Agent, or Firm* — JCIPRNET

(57) ABSTRACT

A multi-chip package and a manufacturing method thereof are provided. The multi-chip package includes: an interposer including a wiring structure and an interposer via electrically connected to the wiring structure; a plurality of semiconductor chips located on a first surface of the interposer and electrically connected to each other through the interposer; an encapsulant located on the first surface of the interposer and encapsulating at least a portion of the plurality of semiconductor chips; and a redistribution circuit structure located on a second surface of the interposer opposite to the first surface, wherein the plurality of semiconductor chips (Continued)

are electrically connected to the redistribution circuit structure through at least the interposer.

20 Claims, 14 Drawing Sheets

(51) Int. Cl.
*H01L 23/00* (2006.01)
*H01L 23/31* (2006.01)

(52) U.S. Cl.
CPC ...... *H01L 21/4857* (2013.01); *H01L 23/5383* (2013.01); *H01L 24/13* (2013.01); *H01L 24/16* (2013.01); *H01L 24/17* (2013.01); *H01L 24/24* (2013.01); *H01L 24/73* (2013.01); *H01L 23/3185* (2013.01); *H01L 2224/1357* (2013.01); *H01L 2224/13609* (2013.01); *H01L 2224/13611* (2013.01); *H01L 2224/13613* (2013.01); *H01L 2224/13639* (2013.01); *H01L 2224/13644* (2013.01); *H01L 2224/13647* (2013.01); *H01L 2224/16225* (2013.01); *H01L 2224/16505* (2013.01); *H01L 2224/1703* (2013.01); *H01L 2224/2402* (2013.01); *H01L 2224/24101* (2013.01); *H01L 2224/24137* (2013.01); *H01L 2224/73204* (2013.01); *H01L 2224/73209* (2013.01)

(58) Field of Classification Search
CPC ......... H01L 24/13; H01L 24/16; H01L 24/17; H01L 24/24; H01L 24/73; H01L 23/3185; H01L 2224/1357; H01L 2224/13609; H01L 2224/13611; H01L 2224/13639; H01L 2224/13644; H01L 2224/13647; H01L 2224/16225; H01L 2224/16505; H01L 2224/1703; H01L 2224/2402; H01L 2224/24101; H01L 2224/24137; H01L 2224/73204; H01L 2224/732
See application file for complete search history.

(56) References Cited

U.S. PATENT DOCUMENTS

| | | | |
|---|---|---|---|
| 10,068,862 | B2 | 9/2018 | Do et al. |
| 10,217,720 | B2 | 2/2019 | Wang et al. |
| 11,424,190 | B2 * | 8/2022 | Chen et al. ........... H01L 21/565 |
| 2018/0350737 | A1 | 12/2018 | Starkston et al. |

FOREIGN PATENT DOCUMENTS

| | | |
|---|---|---|
| TW | 201250945 | 12/2012 |
| TW | I618210 | 3/2018 |
| TW | 201824473 | 7/2018 |
| TW | 201926588 | 7/2019 |

* cited by examiner

MULTI-CHIP PACKAGE AND MANUFACTURING METHOD THEREOF

CROSS-REFERENCE TO RELATED APPLICATION

This application claims the priority benefits of U.S. provisional application Ser. No. 62/912,651, filed on Oct. 9, 2019 and Taiwan application serial no. 109131057, filed on Sep. 10, 2020. The entirety of each of the above-mentioned patent applications is hereby incorporated by reference herein and made a part of this specification.

TECHNICAL FIELD

The disclosure relates to a semiconductor package and a manufacturing method thereof, and relates to a multi-chip package and a manufacturing method thereof.

BACKGROUND

In order for the semiconductor package to have a thin and light volume and high-performance at the same time, current packaging technology has tried to integrate multiple semiconductor chips into a single semiconductor package to form a multi-chip package or to stack multiple semiconductor packages with 3D stacking technology to form a package on package (PoP) structure. However, the speed of signal communication between multiple semiconductor chips in conventional multi-chip package is limited, so the overall performance of the semiconductor package still needs to be further improved.

SUMMARY

The disclosure provides a multi-chip package including an interposer, a plurality of semiconductor chips, an encapsulant and a redistribution circuit structure. The interposer comprises a wiring structure and an interposer via electrically connected to the wiring structure. The plurality of semiconductor chips are disposed on a first surface of the interposer and are electrically connected to each other through the interposer. The encapsulant is disposed on the first surface of the interposer and encapsulates at least a portion of the plurality of semiconductor chips. The redistribution circuit structure is disposed on a second surface of the interposer opposite to the first surface of the interposer. The plurality of semiconductor chips are electrically connected to the redistribution circuit structure at least through the interposer.

The disclosure provides a multi-chip package including an interposer, a plurality of semiconductor chips and a redistribution circuit structure. The interposer comprises a wiring structure, an opening exposing at least a portion of the wiring structure, and an interposer via disposed in the opening and electrically connected to the wiring structure. The plurality of semiconductor chips are disposed on a first surface of the interposer and are electrically connected to each other through the interposer. The redistribution circuit structure is disposed on a second surface of the interposer opposite to the first surface of the interposer and connected to the interposer via. The plurality of semiconductor chips are electrically connected to the redistribution circuit structure at least through the interposer.

The disclosure provides a manufacturing method of a multi-chip package, which includes the following steps. A plurality of semiconductor chips are provided on a first surface of an interposer to connect first conductor of the interposer and second conductor of the plurality of semiconductor chips to each other. An opening is formed in a second surface of the interposer opposite to the first surface of the interposer to expose at least a portion of the wiring structure. An interposer via is formed in the opening of the interposer to be connected to the wiring structure of the interposer. A redistribution circuit structure is formed on the second surface of the interposer to be electrically connected to the interposer via.

Several exemplary embodiments accompanied with figures are described in detail below to further describe the disclosure in details.

DETAILED DESCRIPTION OF DISCLOSED EMBODIMENTS

Figure 1:
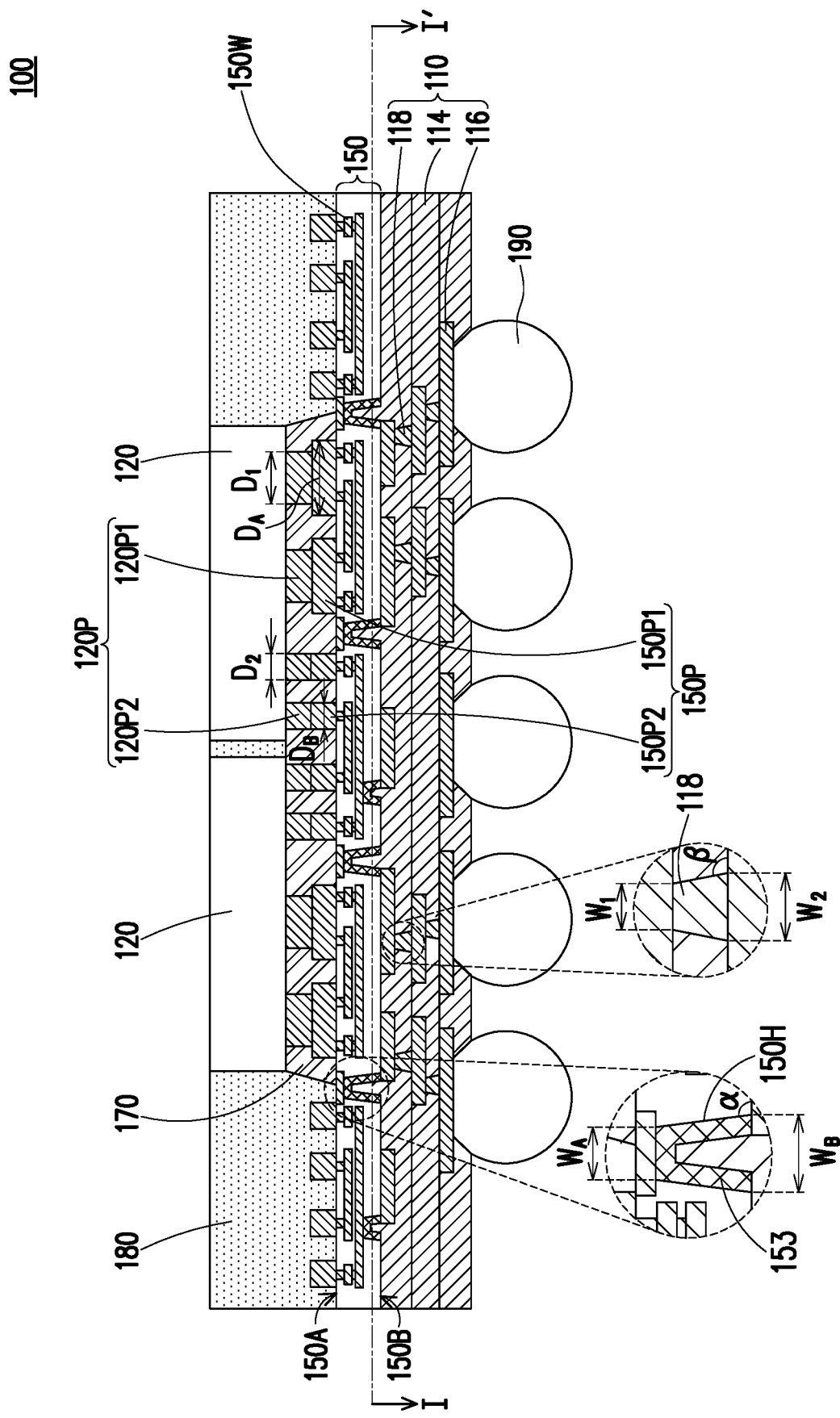
FIG. 1 is a cross-sectional view illustrating a multi-chip package according to an embodiment of the disclosure.

The embodiments are exemplified in detail below with the accompanying drawings, but the embodiments provided are not intended to limit the scope of the disclosure. In addition, the drawings are for illustration purposes only and are not drawn according to the original size. Moreover, although the text uses "first", "second", etc. to describe different elements, regions and/or components, the elements, regions and/or components should not be limited by the terms. Rather, the terms are only used to distinguish one element, region, or component from another element, region, or component. Therefore, a first element, region, or component discussed below may be referred to as a second element, region, or component without departing from the teachings of the embodiments. The same or similar reference numerals indicate the same or similar elements, which will not be reiterated in the following paragraphs.

In the text, spatially relative terms such as "upper" and "lower" are defined with reference to the drawings. Therefore, it should be understood that the term "upper surface" may be used interchangeably with the term "lower surface". Also, when an element such as a layer or film is described as being disposed on another element, the element may be directly placed on the other element or an intermediate element may be present between the two elements. On the other hand, when an element is described as being directly disposed on another element, there is no intermediate element between the two elements. Similarly, when an element is described as being connected or bonded to another element, the element may be directly connected or bonded to another element, or an intermediate element may be present between the two elements. On the other hand, when an element is described as being directly connected or bonded to another element, there is no intermediate element between the two elements.

Figure 2:
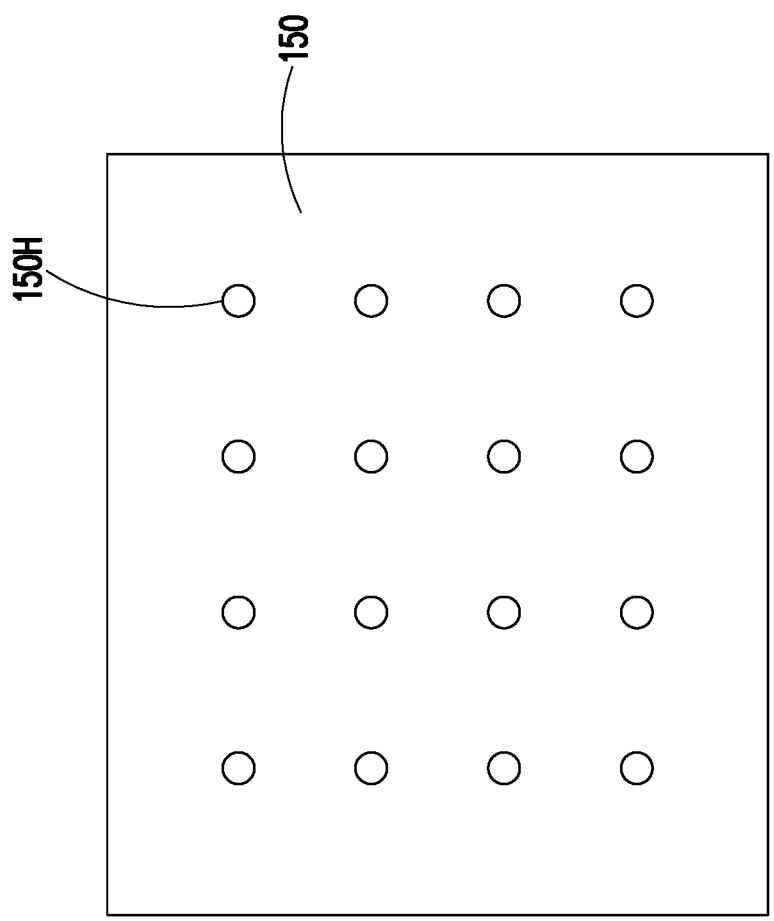
FIG. 2 is a schematic plan view along a line I-I' of the multi-chip package of FIG. 1.

FIG. 1 is a cross-sectional view illustrating a multi-chip package according to an embodiment of the disclosure. FIG. 2 is a schematic plan view along a line I-I' of the multi-chip package of FIG. 1.

Referring to FIG. 1, a multi-chip package 100 according to an embodiment of the disclosure comprises an interposer 150, semiconductor chips 120 on a first surface 150A of the interposer 150 and a redistribution circuit structure 110 on a second surface 150B of the interposer 150. The second surface 150B of the interposer 150 is opposite to the first surface 150A on the interposer 150.

The interposer 150 may be used to connect the side-by-side semiconductor chips 120 to each other and to connect the semiconductor chips 120 to the redistribution circuit structure 110. A wiring structure 150W, an opening 150H exposing the wiring structure 150W and an interposer via 153 disposed in the opening 150H and connected to the wiring structure 150W are included in a body of the interposer 150 and an interposer connection conductor 150P connected to the wiring structure 150W is disposed on the first surface 150A of the interposer 150. The wiring structure 150W may be used to transmit signals, especially high-bandwidth signal, between the side-by-side semiconductor chips 120. The interposer via 153 may electrically connect the wiring structure 150W to the redistribution circuit structure 110.

A redistribution circuit structure is often used to transmit signals between side-by-side semiconductor chips in a System in Package in the art. However, with the increase of high-performance computing applications, the demand for high-bandwidth signal transmission continues increasing. The redistribution circuit structure may comprise limited-number layers for connection due to the line width and line spacing limit and the exposure and development ability of an organic dielectric layer. Therefore, a connection structure with higher circuit density is still required to meet the bandwidth requirements of high bandwidth memory (HBM). The multi-chip package according to the embodiment of the disclosure may improve signal transmission by using the wiring structure 150W which has higher circuit density (i.e., smaller line width and spacing and more layers) compared to the redistribution circuit structure to transfer signals between the semiconductor chips 120.

For example, in the multi-chip package according to the embodiment of the disclosure, the wiring structure 150W may comprise a plurality of layers, for example four or more layers, and the line width, line spacing and via of the wiring structure 150W may be 10 microns or less, respectively. Since the semiconductor chips 120 of the multi-chip package according to the embodiment of the disclosure may be connected by the wiring structure 150W having a line width of less than or equal to 10 micron, a high bandwidth signal may be transmitted between the semiconductor chips 120.

Further, the interposer via 153 may be formed in a back side of the interposer 150 in the multi-chip package 100 according to the embodiment of the disclosure to electrically connect the wiring structure 150W to the redistribution circuit structure 110. The interposer via 153 may not be required to penetrate the interposer in the multi-chip package 100 according to the embodiment of the disclosure. In other words, a through-via structure such as a through silicon via, a through glass via or the like may not be formed in the interposer 150. Therefore, a process of forming the through-via structure in the interposer 150 of the multi-chip package 100 according to the embodiment of the disclosure may be omitted, thereby reducing the cost and improving the yield. However, the disclosure is not limited thereto. A through-via structure may also be formed in the interposer 150, as necessary.

A material of the body of the interposer 150 may be, for example, an inorganic semiconductor material such as silicon (Si), germanium (Ge), or gallium arsenide (GaAs), or glass. The wiring structure 150W may be formed in the body of the interposer 150. The wiring structure 150W may be used to transmit signals, especially high-bandwidth signal, between the semiconductor chips 120. The material of the wiring structure 150W may include, for example, a conductive material such as copper (Cu), silver (Ag), palladium (Pd), aluminum (Al), nickel (Ni), titanium (Ti), gold (Au), platinum (Pt), tungsten (W), an alloy thereof, or other metals or alloys thereof having excellent electrical characteristics. As described above, the wiring structure 150W has a high circuit density. In some embodiments, the wiring structure 150W may comprise a plurality of layers, for example four or more layers, and the line width, line spacing and via of the wiring structure 150W may be 10 microns or less, respectively. For example, the size of the line width, line spacing and via of the wiring structure 150W may each independently be about 1 micron or less, about 2 microns or less, about 3 microns or less, about 4 microns or less, about 5 microns or less, about 6 microns or less, about 7 microns or less, about 8 microns or less, or about 9 microns or less.

Referring to FIG. 2, the interposer 150 may have a plurality of openings 150H. The plurality of openings 150H may pass at least a portion of the interposer 150 from the second surface of the interposer 150, but not penetrate the interposer 150. In other words, the plurality of openings 150H may not directly contact the first surface 150A of the interposer 150. The plurality of openings 150H may have different depths, and thus the plurality of openings 150H may respectively expose the wiring structure on the different levels. Referring to the enlarged view in FIG. 1, the width WB of one end of the opening 150H closer to the second surface 150B may be larger than the width WA of the other end of the opening 150H closer to the first surface 150A. In other words, an actuated angle α between the tapered sidewalls of the opening 150H and the second surface 150B may be greater than 90°. In other words, the width of the opening 150H increases as the distance from the semiconductor chips 120 increases. The interposer via 153 may be disposed on side walls of the opening 150H. A material of the interposer via 153 may include, for example, a conductive material such as copper (Cu), silver (Ag), palladium (Pd), aluminum (Al), nickel (Ni), titanium (Ti), gold (Au), platinum (Pt), tungsten (W), an alloy thereof, etc. The interposer via 153 may be used to electrically connect the wiring structure 150W of the interposer 150 and a redistribution circuit layer 116 of the redistribution circuit structure 110 with each other. As shown in FIG. 1, the interposer via 153 may be conformally formed on the wall surface of the opening 150H, i.e. in a form of a thin layer on the wall surface of the opening 150H. In other embodiments, the interposer via 153 may fill the entire opening 150H.

An interposer connection conductor 150P are formed on the first surface 150A of the interposer 150. The interposer connection conductor 150P may be used to connect the interposer 150 to other devices. A material of the interposer connection conductor 150P may include, for example, a conductive material such as copper (Cu), silver (Ag), palladium (Pd), aluminum (Al), nickel (Ni), titanium (Ti), gold (Au), platinum (Pt), tungsten (W), an alloy thereof, or other metals or alloys thereof having excellent electrical characteristics. The shape of the interposer connection conductor 150P may include various shapes such as a post shape, a stud bump, etc. The interposer connection conductor 150P may have different sizes. For example, the interposer connection conductor 150P may include a first interposer connection conductor 150P1 and a second interposer connection conductor 150P2 having different sizes and the size of the first interposer connection conductor 150P1 may be larger than the size of the second interposer connection conductor 150P2. In other words, the width DA of the first interposer connection conductor 150P1 is greater than the width DB of the second interposer connection conductor 150P2. In some embodiments, the interposer connection conductor 150P may have the same size.

The semiconductor chips 120 may be any suitable integrated circuit (IC) chips, such as a memory chip, a logic chip, a digital chip, an analog chip, a sensor chip, an artificial intelligence (AI) chip, a wireless and radio frequency chip, a voltage regulator chip, etc. The sensor chip may be an image sensor chip, including at least a CCD or a CMOS image sensor. Although two semiconductor chips 120 are included in the multi-chip package 100, the disclosure is not limited thereto. For example, the multi-chip package according to the embodiment of the disclosure may include three or more semiconductor chips 120. In some embodiments, the lateral distance between the respective semiconductor chips 120 may be maintained constant. In other words, the semiconductor chips 120 are arranged equidistantly on the interposer 150. In other embodiments, the lateral distance between the respective semiconductor chips 120 may vary. In other words, the semiconductor chips 120 are arranged unequidistantly on the interposer 150. The respective semiconductor chips 120 may be separated from each other by an encapsulant 180 to be described below.

A chip connection conductor 120P is disposed on an active surface of the semiconductor chips 120. A material of the chip connection conductor 120P may include, for example, a conductive material such as copper (Cu), silver (Ag), palladium (Pd), aluminum (Al), nickel (Ni), titanium (Ti), gold (Au), platinum (Pt), tungsten (W), an alloy thereof, or other metals or alloys thereof having excellent electrical characteristics. The shape of the chip connection conductor 120P may include various shapes such as a post shape, a stud bump, etc. The chip connection conductor 120P may have different sizes. For example, the chip connection conductor 120P may include a first chip connection conductor 120P1 and a second chip connection conductor 120P2 having different sizes and the size of the first chip connection conductor 120P1 may be larger than the size of the second chip connection conductor 120P2. In other words, the width D1 of the first chip connection conductor 120P1 is greater than the width D2 of the second chip connection conductor 120P2. The chip connection conductor 120P and at least a portion of the interposer connection conductor 150P are bonded to each other. In some embodiments, the respective chip connection conductor 120P and the respective interposer connection conductor 150P that are bonded to each other correspondingly may have corresponding sizes. For example, the larger first chip connection conductor 120P1 may be bonded to the larger first interposer connection conductor 150P1, and the smaller second chip connection conductor 120P2 may be connected to the smaller second interposer connection conductor 150P2. In this case, the larger first chip connection conductor 120P1 and the larger first interposer connection conductor 150P1 may be used to transmit high currents (such as ground), while the smaller second chip connection conductor 120P2 and the smaller second interposer connection conductor 150P2 may be used to transmit high-bandwidth signals. A bonding surface between the chip connection conductor 120P and the interposer connection conductor 150P may be a solderless bonding surface. Since the interposer 150 and the semiconductor chips 120 are connected to each other by the chip connection conductor 120P and the interposer connection conductor 150P instead of the redistribution circuit structure, the power and/or signal transmission path between the interposer 150 and the semiconductor chips 120 may be shortened, and thus the transmission speed and quality of power and/or signal may be improved. In some embodiments, bumps (see FIG. 4B) may be further disposed between the chip connection conductor 120P and the interposer connection conductor 150P.

Further, the side-by-side semiconductor chips 120 may be connected to each other through the wiring structure 150W within the interposer 150.

As described above, the high-density wiring structure 150W for the interconnection between chips may have a line width of 10 micron or less, so high bandwidth signals may be transmitted between the wiring structure 150W and the semiconductor chips 120. In addition, depending on the signal or current to be transmitted, signals that require a faster transmission speed or a larger bandwidth may be transmitted through the second chip connection conductor 120P2 and the second interposer connection conductor 150P2, while power or ground may be transmitted through the first chip connection conductor 120P1 and the first interposer connection conductor 150P1. In other words, in the multi-chip package 100 according to the embodiment of the disclosure, the signals transmitted between the semiconductor chips 120 may be transmitted through different paths depending on the nature of the signal.

An underfill may be disposed between the semiconductor chips 120 and the interposer 150 of the multi-chip package 100 according to the embodiment of the disclosure. The underfill 170 may fill a space between the semiconductor chips 120 and the interposer 150 and encapsulate the interposer connection conductor 150P and the chip connection conductor 120P. The underfill 170 has tapered sidewalls. The upper width of the underfill 170 may be smaller than the lower width of the underfill 170. In some embodiments, the width of the underfill 170 gradually changes, and the width of the underfill 170 gradually decreases from one end closer to the interposer 150 toward the other end closer to the semiconductor chips 120. The material of the underfill 170 is not particularly limited, and may be, for example, an insulating material such as epoxy resin. In other embodiments, a passivation layer 175 instead of the underfill 170 may be disposed between the semiconductor chips 120 and the interposer 150 in the multi-chip package 100 according to the embodiment of the disclosure (see FIG. 5B).

An encapsulant 180 may be disposed on the interposer 150 to encapsulate the semiconductor chips 120 and the interposer 150 in the multi-chip package 100 according to the embodiment of the disclosure. The encapsulant 180 may be disposed between the semiconductor chips 120 to separate the semiconductor chips 120 from each other. The material of the encapsulant 180 may include a molding compound, a molding underfill, a resin, an EMC, etc. The encapsulant 180 may be doped with an inorganic filler as required. A sidewall of the encapsulant 180, a sidewall of the interposer 150, and a sidewall of the redistribution circuit structure 110 may be aligned with each other.

The redistribution circuit structure 110 is disposed on the second surface 150B of the interposer 150 and may be used to rewiring the I/O terminals of the semiconductor chips 120. For example, the redistribution circuit structure 110 may be used to fan out the I/O terminals of the semiconductor chips 120 to connect the semiconductor chips 120 and a printed circuit board (PCB) (not shown). The redistribution circuit structure 110 includes a plurality of dielectric layers 114 and a plurality of redistribution circuit layers 116 embedded in the dielectric layer 114. The material of the dielectric layer 114 may include polyimide, epoxy resin, acrylic resin, phenolic resin, bismaleimide-trizine (BT) resin, or any other suitable polymer dielectric material and a silicon oxide layer, a silicon nitride layer, a silicon oxynitride layer, or other suitable silicon dielectric materials. In some embodiments, the material of the dielectric layer 114 may include a photosensitive insulating resin. A material of the redistribution circuit layers 116 may include, for example, a conductive material such as copper (Cu), silver (Ag), palladium (Pd), aluminum (Al), nickel (Ni), titanium (Ti), gold (Au), platinum (Pt), tungsten (W), an alloy thereof, etc.

The redistribution circuit structure 110 may further include redistribution vias 118 connecting the redistribution circuit layers 116 on different levels. A material of the redistribution vias 118 may include, for example, a conductive material such as copper (Cu), silver (Ag), palladium (Pd), aluminum (Al), nickel (Ni), titanium (Ti), gold (Au), platinum (Pt), tungsten (W), an alloy thereof, etc. The upper width $W_1$ of the redistribution vias 118 may be less than the lower width $W2$ of the redistribution vias 118. In other words, an actuate angle β between the tapered sidewalls of the redistribution vias 118 and the lower surface of the dielectric layer 114 may be greater than 90°.

Although in FIG. 1, the redistribution circuit structure 110 is shown as including three layers of the dielectric layer 114 and three layers of the redistribution circuit layer 116, the disclosure is not limited thereto. The multi-chip package 100 according to the embodiment of the disclosure may include more or fewer layers of the dielectric layer 114 and the redistribution circuit layer 116 than those shown in the drawing.

The multi-chip package 100 according to the disclosure may further include conductive terminals 190. The conductive terminals 190 are partially embedded in the lowermost dielectric layer 114 to be connected to the lowermost redistribution circuit layer 116. The conductive terminals 190 may be used to connect the multi-chip package 100 with external devices such as the printed circuit board. The conductive terminals 190 may be, for example, a solder ball, but the disclosure is not limited thereto.

In the multi-chip package 100 according to the embodiment of the disclosure, signals may be transmitted between the side-by-side semiconductor chips 120 with high efficiency by the interposer 150 having the wiring structure 150W with high circuit density and high layer numbers. Meanwhile, the multi-chip package 100 according to the embodiment of the disclosure may be a fan-out package by rewiring the semiconductor chips 120 with the redistribution circuit structure 110.

Figure 4A:
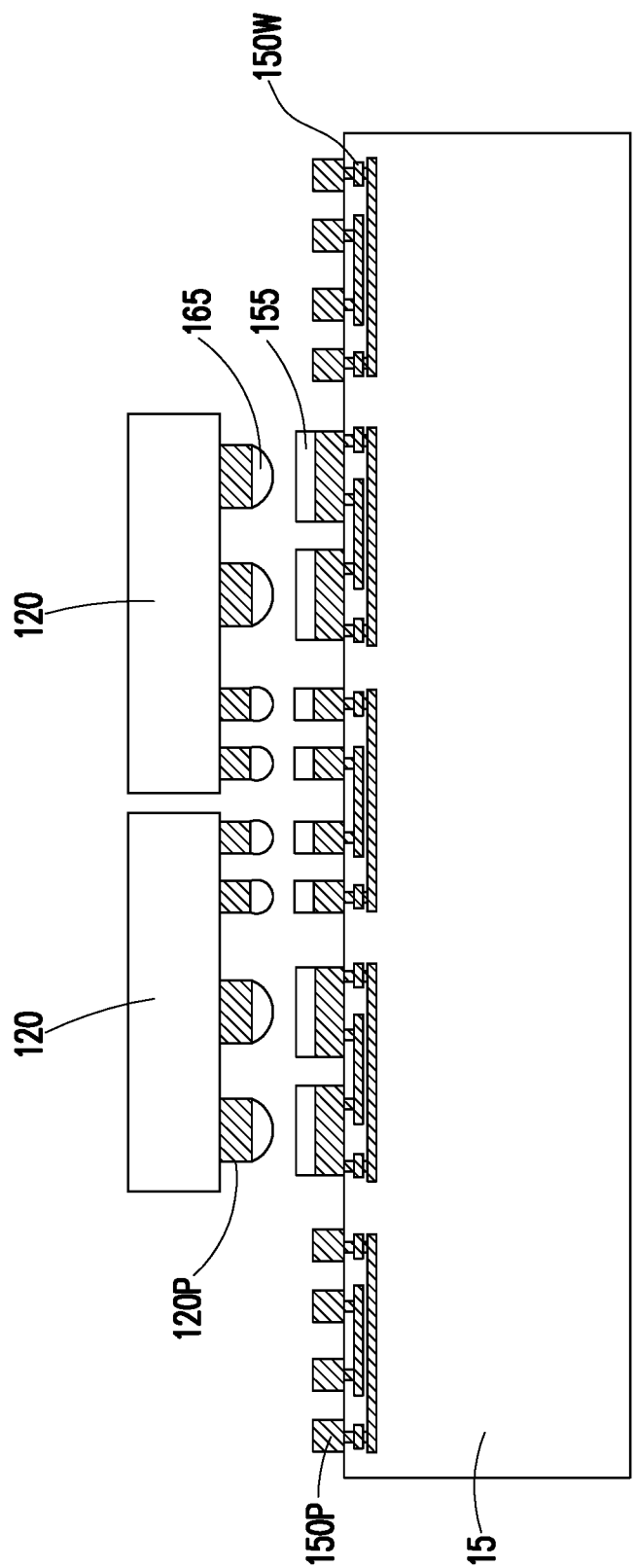
FIGS. 4A and 4B are schematic cross-sectional views to illustrate a method of bonding chips according to an embodiment of the disclosure.
Figure 4B:
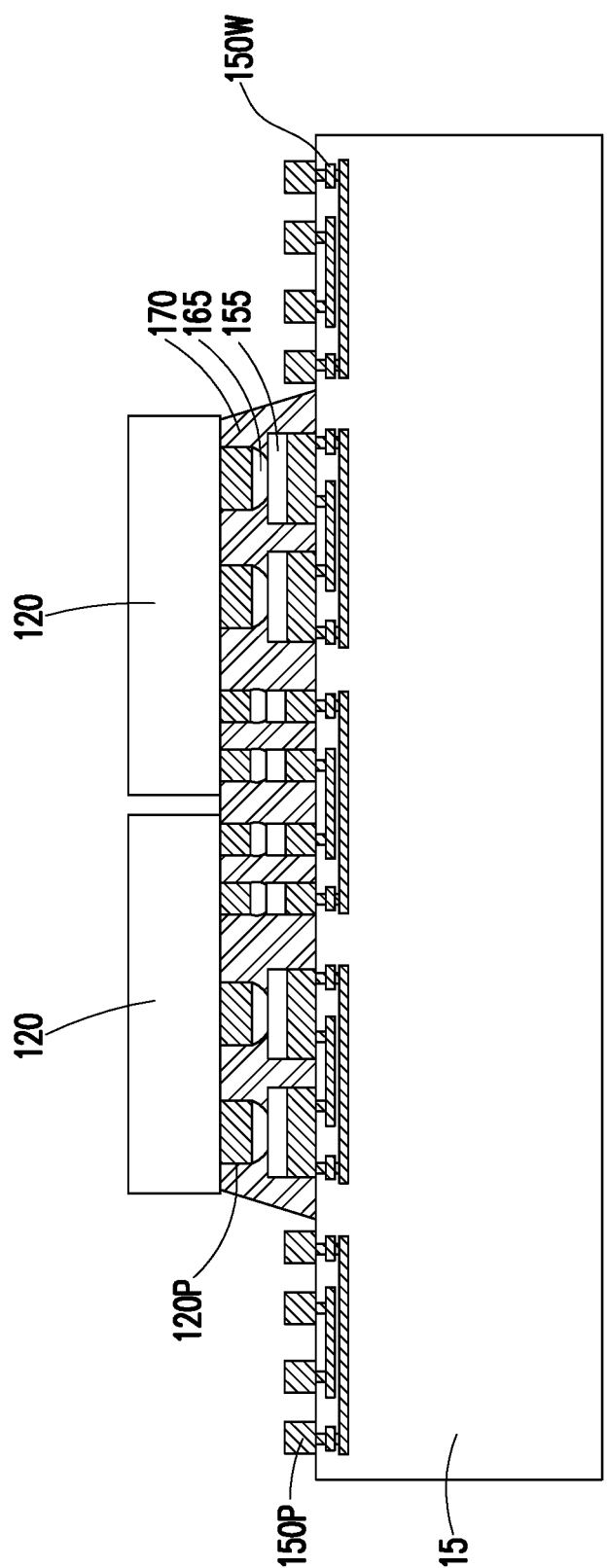
Figure 5A:
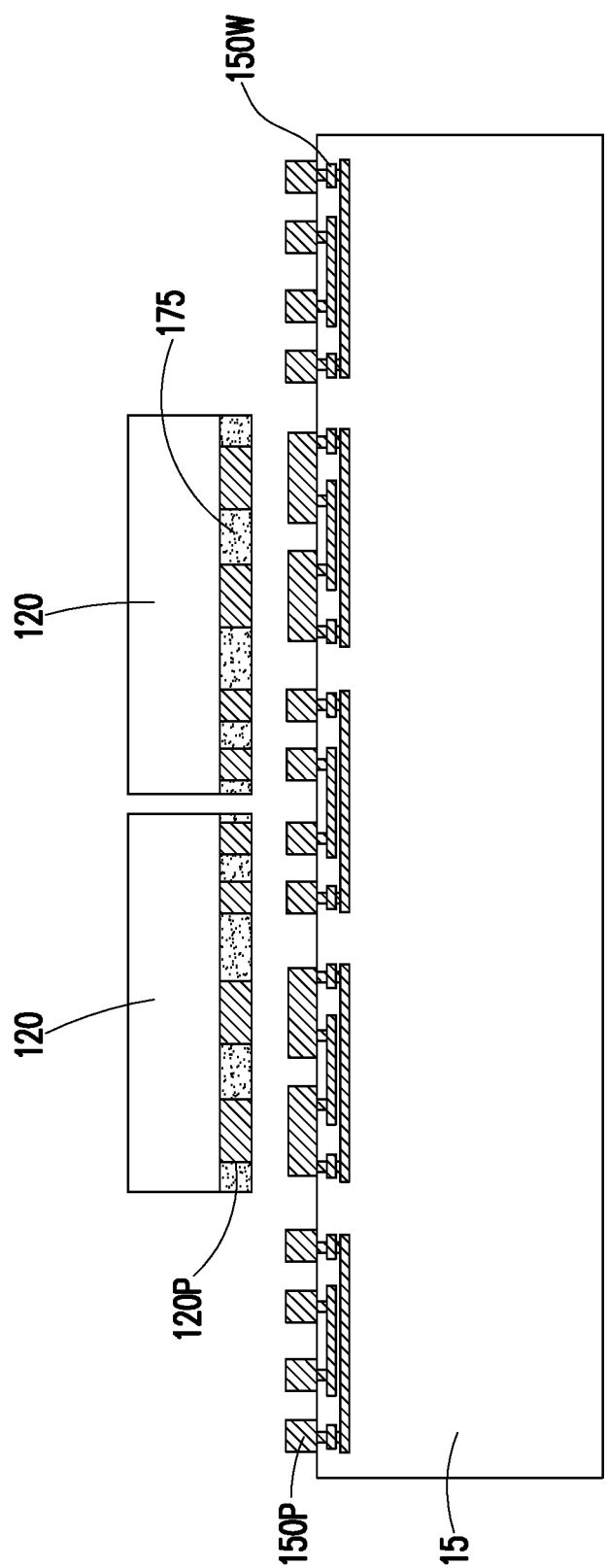
FIGS. 5A and 5B are schematic cross-sectional views to illustrate a method of bonding chips according to another embodiment of the disclosure.
Figure 5B:
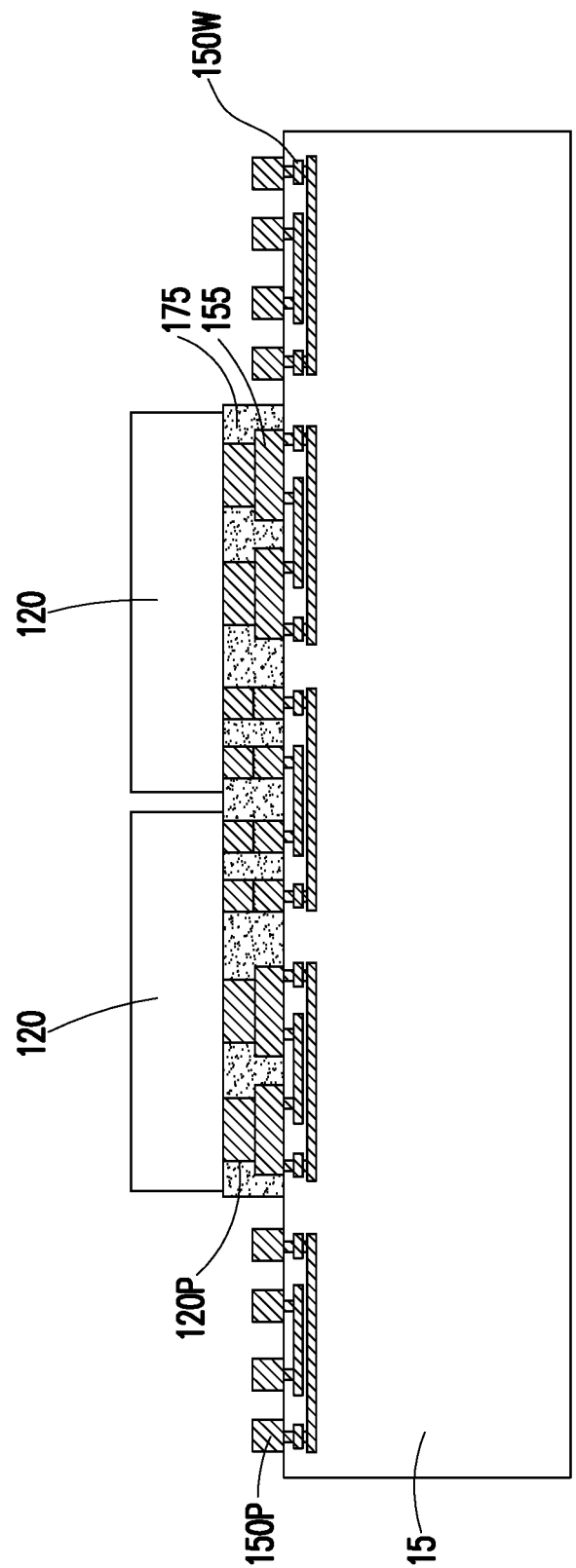

FIGS. 3A to 13H are cross-sectional views of steps of a manufacturing process for manufacturing a multi-chip package according to an embodiment of the disclosure. FIGS. 4A and 4B are schematic cross-sectional views to illustrate a method of bonding chips according to an embodiment of the disclosure. FIGS. 5A and 5B are schematic cross-sectional views to illustrate a method of bonding chips according to another embodiment of the disclosure.

Figure 3A:
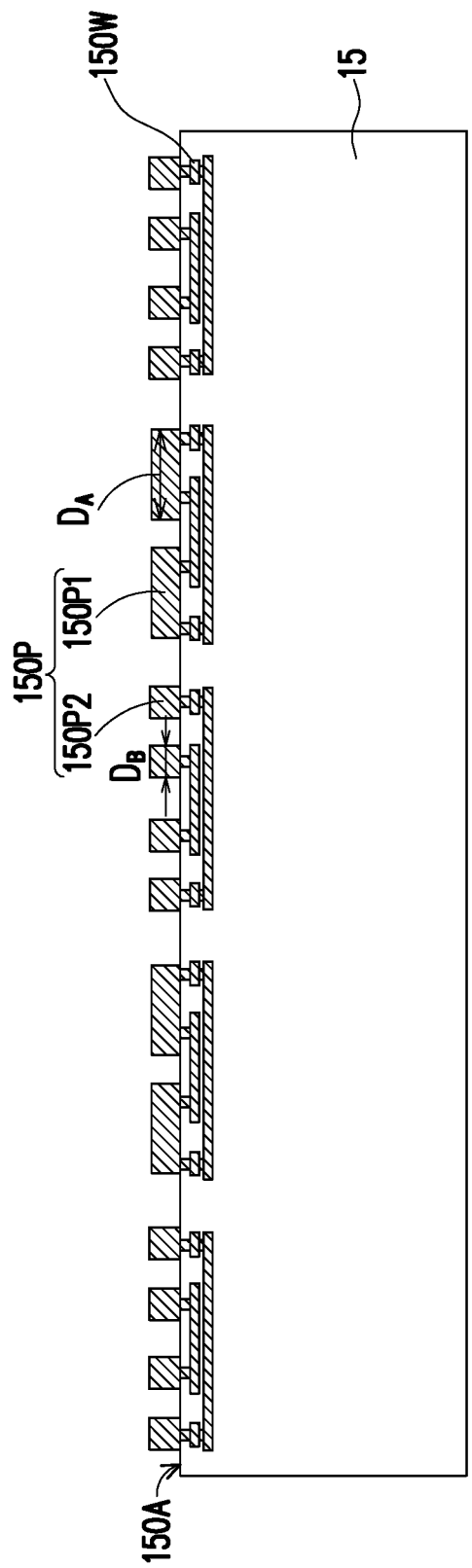
FIGS. 3A to 3H are cross-sectional views of steps of a manufacturing process for manufacturing a multi-chip package according to an embodiment of the disclosure.

Referring to FIG. 3A, a semiconductor substrate 15 having a wiring structure 150W is provided. The semiconductor substrate 15 may be, for example, a silicon substrate. Although only one multi-chip package is illustrated to be formed in the semiconductor substrate 15 in the drawings, in some embodiments, a plurality of multi-chip packages may be formed in a large-sized semiconductor substrate 15 at the same time. For example, a silicon wafer or a panel-level silicon substrate may be used as the semiconductor substrate 15. An interposer connection conductor 150P electrically connecting to the wiring structure 150W may be disposed on the first surface 150A of the semiconductor substrate 15. The interposer connection conductor 150P may include a first interposer connection conductor 150P1 and a second interposer connection conductor 150P2 having different sizes. In other words, the width DA of the first interposer connection conductor 150P1 is greater than the width DB of the second interposer connection conductor 150P2. Optionally, the width DA of the first interposer connection conductor 150P1 may be the same as the width DB of the second interposer connection conductor 150P2.

Figure 3B:
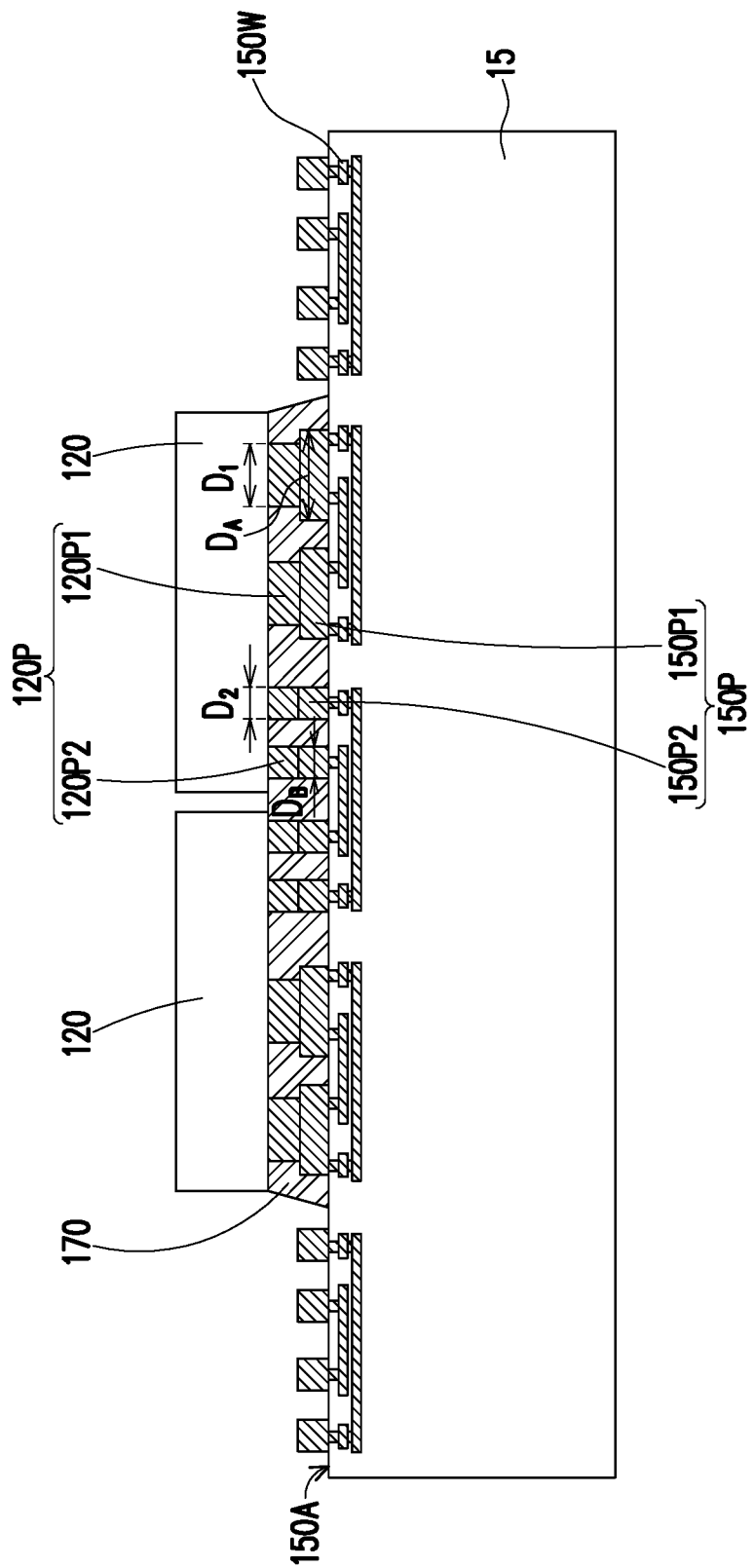

Referring to FIG. 3B, a plurality of semiconductor chips 120 are provided on the semiconductor substrate 15 so that the chip connection conductor 120P and the interposer connection conductor 150P are aligned and bonded to each other. The chip connection conductor 120P may include a first chip connection conductor 120P1 and a second chip connection conductor 120P2 having different sizes. In other words, the width D1 of the first chip connection conductor 120P1 may be greater than the width D2 of the second chip connection conductor 120P2. In some embodiments, the larger-sized first chip connection conductor 120P1 and the larger-sized first interposer connection conductor 150P1 are bonded to each other, and the smaller-sized second chip connection conductor 120P2 and the smaller-sized second interposer connection conductor 150P2 are bonded to each other. The chip connection conductor 120P and the interposer connection conductor 150P may be directly bonded by, for example, heating and/or pressuring. After bonding the chip connection conductor 120P and the interposer connection conductor 150P, an underfill 170 may be applied on the semiconductor substrate 15 to encapsulate the chip connection conductor 120P and the interposer connection conductor 150P.

In some embodiments, the chip connection conductor 120P and the interposer connection conductor 150P may be bonded to each other by bumps. Referring to FIG. 4A, a first bump 155 may be formed on the interposer connection conductor 150P and a second bump 165 may be formed on the chip connection conductor 120P. The first bump 155 and the second bump 165 are then bonded to each other with thermal energy and/or pressure. The material of the first bump 155 and the second bump 165 may independent be an bonding metal, for example, solder alloy such as Cu/Sn, Cu/Ni/Sn, and Cu/Ni/SnBi, copper, gold, silver, indium, palladium, titanium, manganese, cobalt, or alloys thereof such as Ni/Au, Cu/Ni/Au, and Cu/Ni/In. The material of the first bump 155 and the material of the second bump 165 may be different from each other. For instance, the material of the first bump 155 may be surface-treated pure copper, Ni/Au alloy, Cu/Ni/Au alloy or Cu/Ni/In alloy, etc., and the material of the second bump 165 may be Cu/Sn, Cu/Ni/Sn or Cu/Ni/SnBi alloy, etc. In some embodiments, the materials of the first bump 155 and the second bump 165 do not contain solder components. In some embodiments, the materials of the first bump 155 and the second bump 165 may be a low-temperature bonding metal with a melting point lower than 200° C. For example, the low-temperature bonding metal may include twin crystal copper, twin crystal silver, or other nano-twin materials, an indium tin alloy, a tin bismuth alloy, porous gold, or a combination thereof. Compared to traditional solder balls or solders, which usually require a reflow temperature of higher than or equal to 250° C., the use of the low-temperature bonding metal enables the connection structure to achieve stable bonding at a relatively lower heating temperature (for example, at a temperature below 200° C. or below 150° C.) and meets the reliability requirement of electrical connection requirement. In some embodiments, it is possible that only one of the first bump 155 and the second bump 165 is formed. For instance, it is possible that only the first bump 155 is formed on the interposer connection conductor 150P and the first bump 155 is bonded to the chip connection conductor 120P.

Next, referring to FIG. 4B, after the first bump 155 and the second bump 165 are bonded, the underfill 170 may be applied on the semiconductor substrate 15 to encapsulate the chip connection conductor 120P, the interposer connection conductor 150P, the first bump 155 and the second bump 165. The underfill 170 may fill a space between the semiconductor chips 120 and the semiconductor substrate 15 and encapsulate the interposer connection conductor 150P, the chip connection conductor 120P, the first bump 155 and the second bump 165.

Referring to FIG. 5A and FIG. 5B, in some embodiments, the passivation layer 175 may be formed on the semiconductor chips 120. The material of the passivation layer 175 may be an organic material such as resin, non-conductive adhesive film, dielectric material or the like. A surface of the chip connection conductor 120P and a surface of the passivation layer 175 between the semiconductor chips 120 may be coplanar. When the chip connection conductor 120P and the interposer connection conductor 150P are bonded to each other, as being encapsulated by the passivation layer 175 and exposed only the surface for connection, the chip connection conductor 120P may be prevented from being damaged by external force. In this way, yield rate may be improved.

Referring back to FIG. 3C, the encapsulant 180 is formed on the semiconductor substrate 15. A forming method of the encapsulant 180 includes the following steps. An encapsulating material layer covering the semiconductor substrate 15 and the semiconductor chips 120 is formed on the semiconductor substrate 15 by a suitable process (e.g., a molding process or a deposition process). Afterwards, a surface grinding and polishing process or a surface planarization process is performed to expose upper surfaces of the semiconductor chips 120.

Figure 3C:
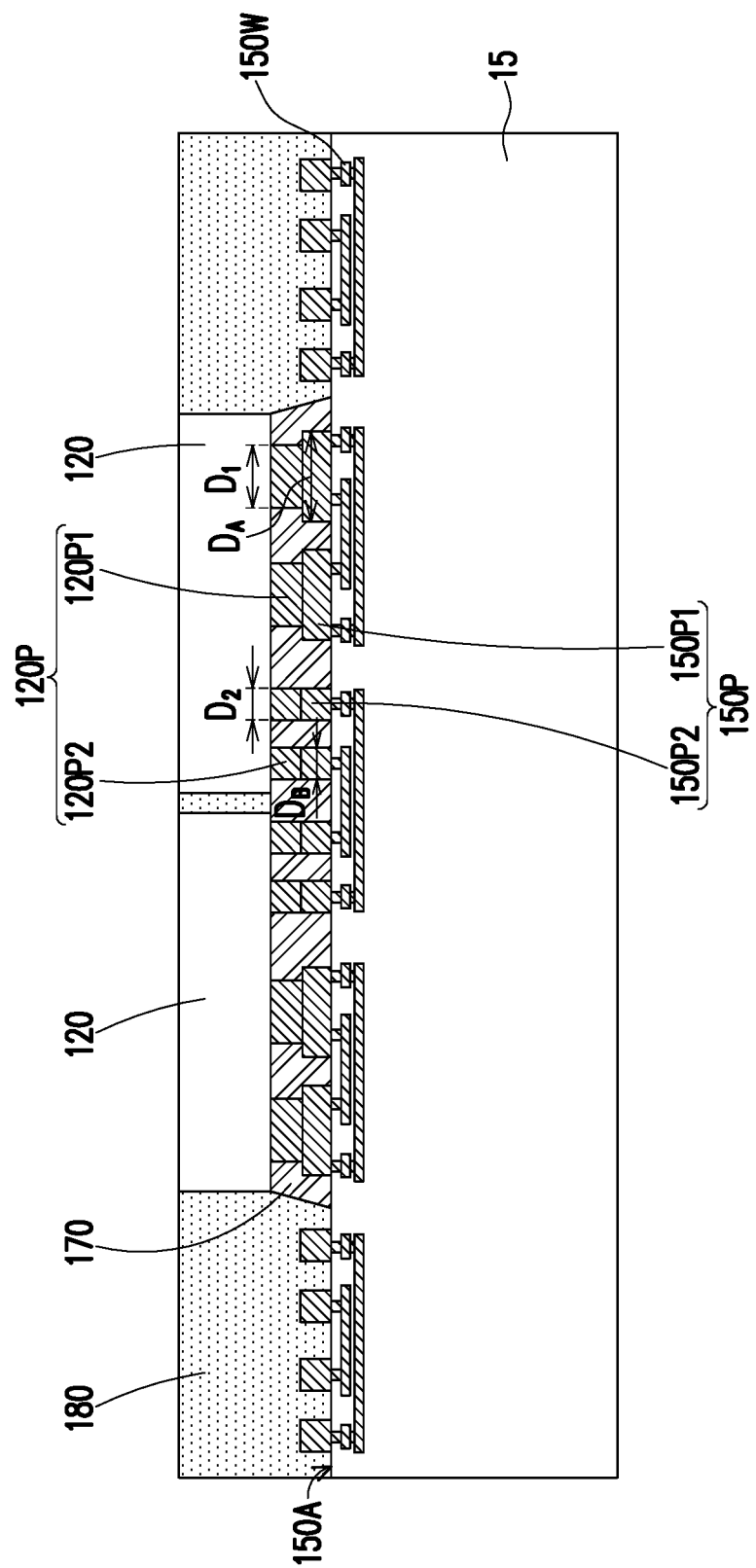
Figure 3D:
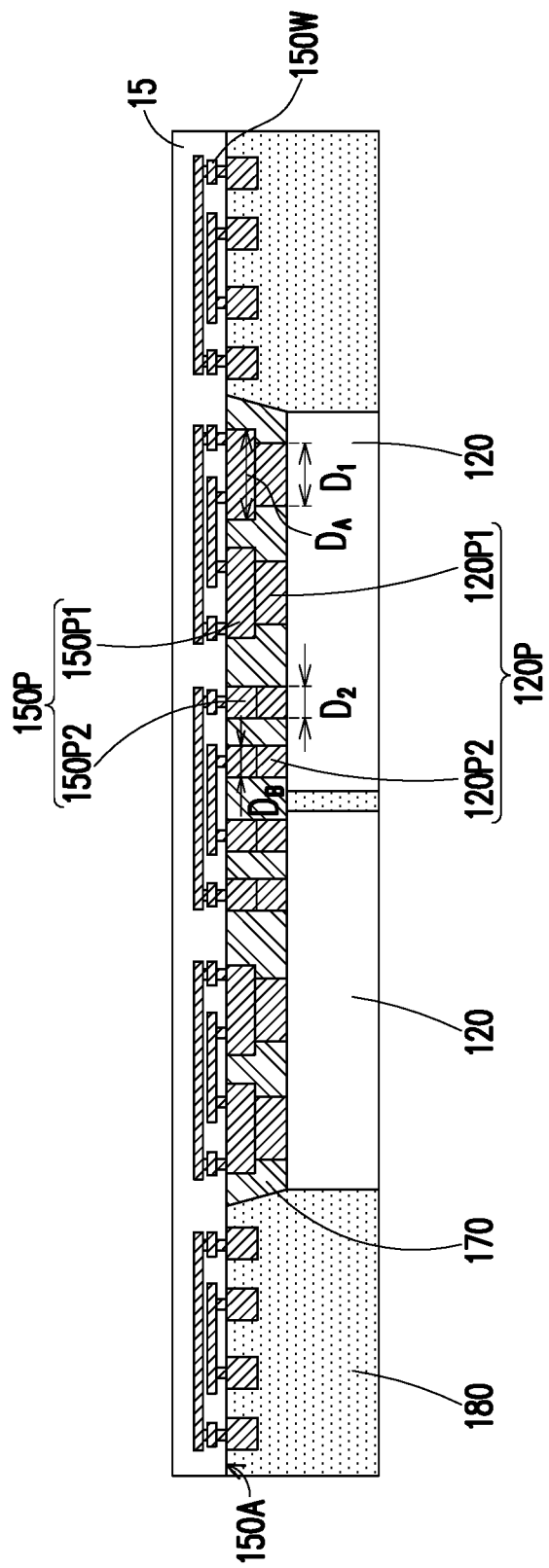

Next, referring to FIG. 3C and FIG. 3D, the structure obtained in FIG. 3C is turned upside down, and a thinning process such as a grinding process or an etching process is performed on a back surface of the semiconductor substrate 15 to reduce a thickness of the semiconductor substrate 15. The purpose of reducing the thickness of the semiconductor substrate 15 is to miniaturize and thin the final multi-chip package. In addition, the reduced thickness of the semiconductor substrate 15 also contributes to the subsequent formation of the opening 150H. If necessary, this step may be omitted. The thinned semiconductor substrate 15 is hereinafter referred to as an interposer 150.

Figure 3E:
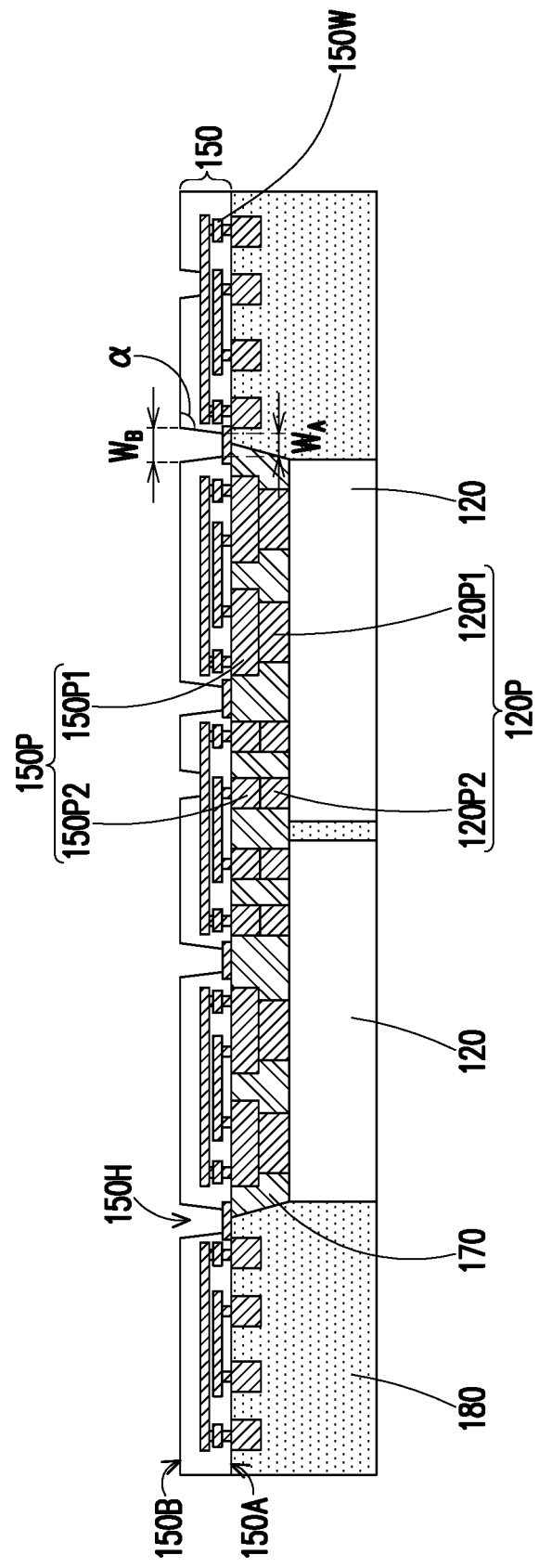

Referring to FIG. 3E, a plurality of openings 150H are formed in the interposer 150, for example, by an etching process to expose at least a portion of the wiring structure 150W. Referring to the enlarged view in FIG. 3E, the width WB of the opening 150H closer to the second surface 150B may be greater than the width WA closer to the first surface 150A. In other words, an actuated angle α between the tapered sidewalls of the opening 150H and the second surface 150B may be greater than 90°. In other words, the width of the opening 150H increases as the distance from the semiconductor chips 120 increases.

Figure 3F:
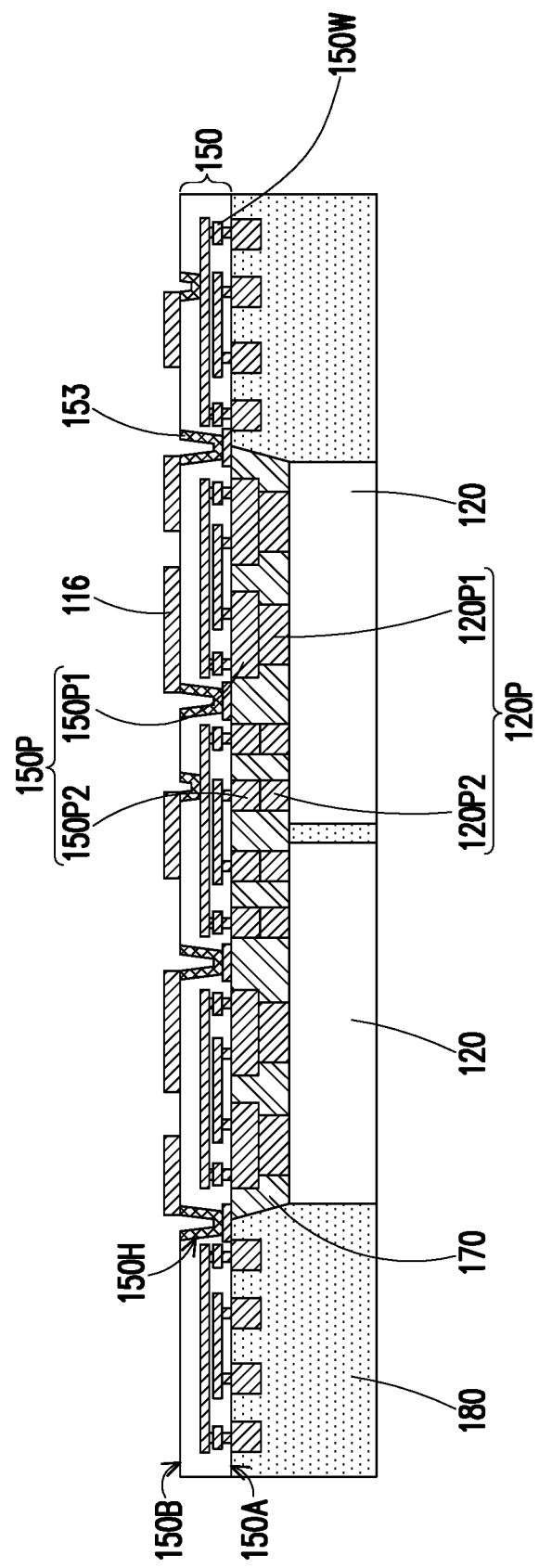

Referring to FIG. 3F, a redistribution circuit layer 116 and an interposer via 153 are formed on the second surface 150B of the interposer 150 and the surface of the opening 150H, respectively. The redistribution circuit layer 116 and the interposer via 153 may be integrally formed. For example, the process of forming the redistribution circuit layer 116 and the interposer via 153 includes the following steps. First, a seed layer is sputtered or deposited on the second surface 150B of the interposer 150 and the surface of the opening 150H. Here, the material of the seed layer may be a conductive material such as titanium/copper. Next, a patterned photoresist layer is formed on the seed layer to expose the seed layer. A conductive material is formed on the seed layer exposed by the patterned photoresist layer by an electroplating process. The conductive material may include copper (Cu), silver (Ag), palladium (Pd), aluminum (Al), nickel (Ni), titanium (Ti), gold (Au), platinum (Pt), tungsten (W), or an alloy thereof. Next, the photoresist layer and the portion of the seed layer not covered by the conductive material are removed to form the redistribution circuit layer 116 and the interposer via 153.

Figure 3G:
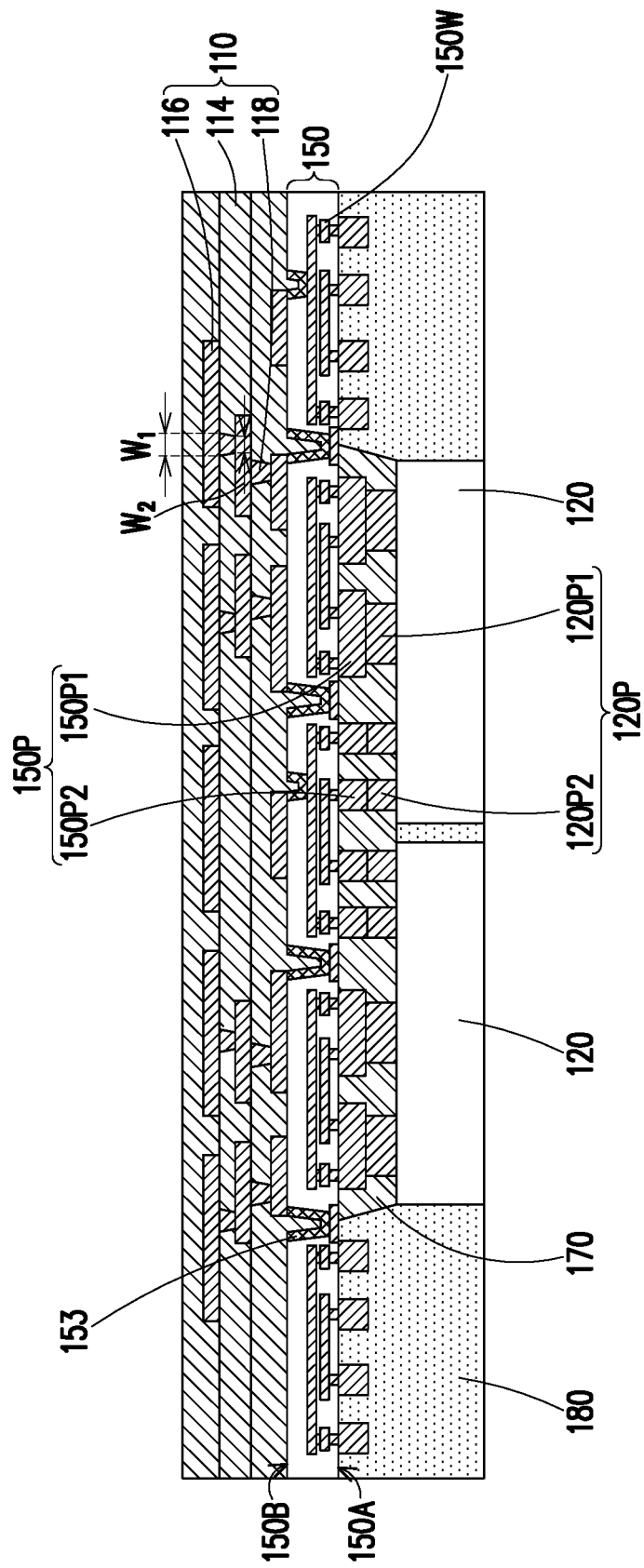

Referring to FIG. 3G, a dielectric layer 114 may be formed on the redistribution circuit layer 116 and on the interposer via 153, thereby forming the redistribution circuit structure 110. The method for forming the dielectric layer 114 may include spin coating, chemical vapor deposition (CVD), plasma-enhanced chemical vapor deposition (PECVD), etc. The dielectric layer 114 may fill a space of the opening 150H that is not occupied by the interposer via 153.

The redistribution circuit structure 110 may include a multi-layer or single-layer redistribution circuit layer 116. When the redistribution circuit structure 110 includes the multi-layer redistribution circuit layer 116, a process of forming the upper layer of the redistribution circuit layer 116 includes the following steps. First, a via hole is formed in the dielectric layer 114 to expose the redistribution circuit layer 116 thereunder, wherein the method for forming the via hole in the dielectric layer 114 may be different depending on the material of the dielectric layer 114. When the dielectric layer 114 is a photosensitive insulating layer including a photosensitive insulating resin, the dielectric layer 114 may be patterned by a lithography process to form the via hole. When the dielectric layer 114 is a non-photosensitive insulating layer, the dielectric layer 114 may be patterned by a lithography/etching process, a laser drilling process, or a mechanical drilling process to form the via hole. Then, the upper layer of the redistribution circuit layer 116 and the interposer via 153 filling the via hole are formed by the same method as the aforementioned method of forming the redistribution circuit layer 116 to be connected to the redistribution circuit layer 116 exposed by the via hole. Although in the drawings, the redistribution circuit structure 110 is shown as including three layers of the dielectric layer 114 and three layers of the redistribution circuit layer 116, the disclosure is not limited thereto. The redistribution circuit structure 110 may include more or less layers of the dielectric layer 114 and the redistribution circuit layer 116 than the drawing.

Figure 3H:
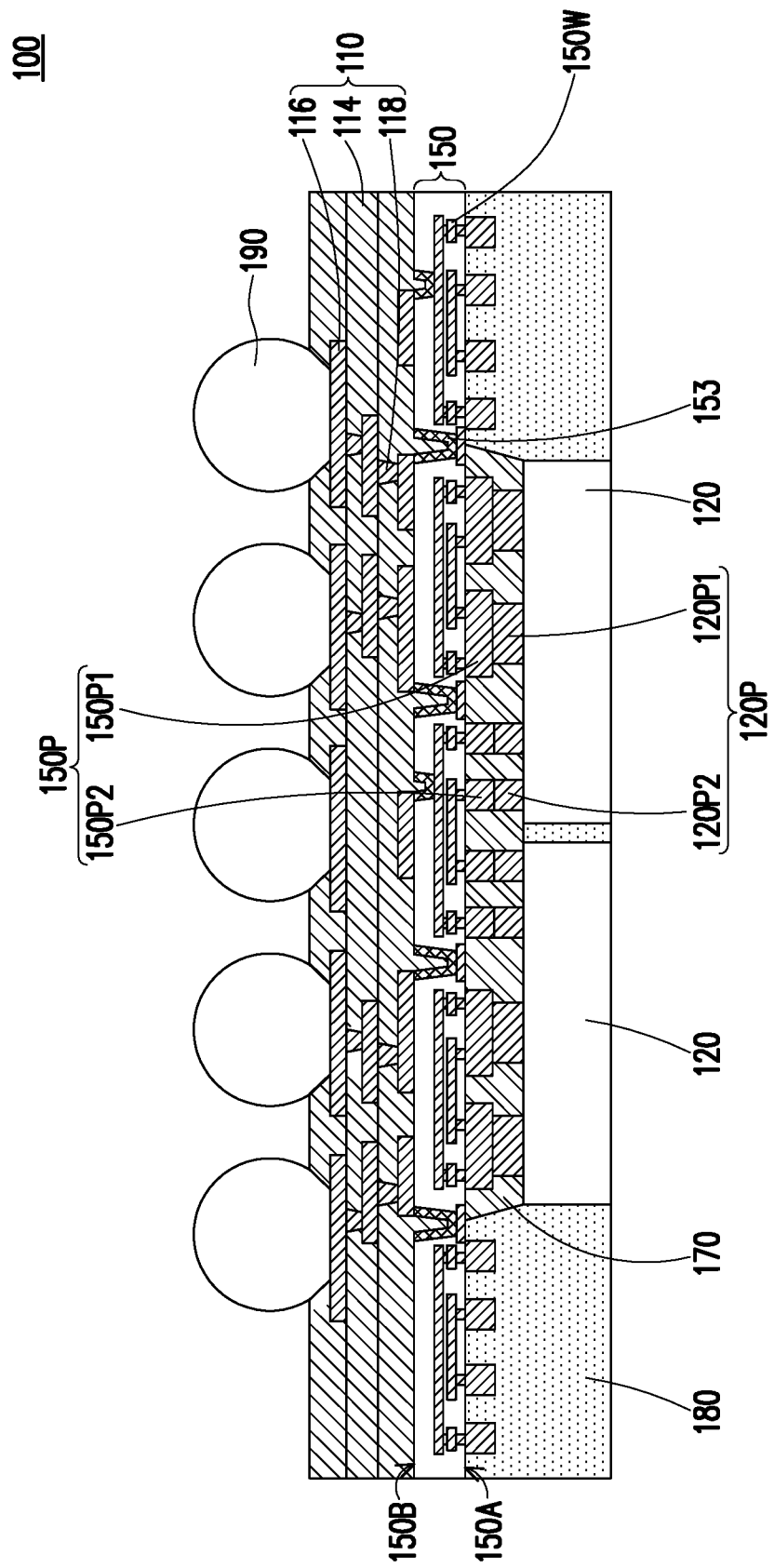

Referring to FIG. 3H, multiple conductive terminals 190 may be formed on the redistribution circuit structure 110 to complete a multi-chip package 100 of the disclosure. The semiconductor substrate 15 having a large size may be used to simultaneously form multiple multi-chip packages 100 of the disclosure. Then, each of the multi-chip packages 100 is separated by processes such as cutting. Therefore, the sidewall of the interposer 150 in the multi-chip package and the sidewall 180 in the multi-chip package 100 of the disclosure may be aligned with the sidewall of the redistribution circuit structure 110.

In summary, the disclosure provides a multi-chip package and a manufacturing method thereof. The multi-chip package of the disclosure could shorten the power and/or signal transmission paths in the multi-chip package and improve overall performance of the multi-chip package. At the same time, the multi-chip package of the disclosure also includes a redistribution structure to provide the design freedom for the fan-out package.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A multi-chip package, comprising:
   an interposer comprising a wiring structure and an interposer via electrically connected to the wiring structure;
   a plurality of semiconductor chips disposed on a first surface of the interposer and electrically connected to each other through the interposer;
   an encapsulant disposed on the first surface of the interposer and encapsulating at least a portion of the plurality of semiconductor chips; and
   a redistribution circuit structure disposed on a second surface of the interposer opposite to the first surface of the interposer,
   wherein the plurality of semiconductor chips are electrically connected to the redistribution circuit structure at least through the interposer.

2. The multi-chip package according to claim 1, wherein an interposer connection conductor is disposed on the first surface of the interposer, a chip connection conductor is disposed on a surface of each of the plurality of semiconductor chips closely adjacent to the interposer, and the interposer connection conductor and the chip connection conductor are bonded to each other.

3. The multi-chip package according to claim 2, wherein a bonding surface between the interposer connection conductor and the chip connection conductor is a solderless bonding surface.

4. The multi-chip package according to claim 2, wherein the interposer connection conductor and the chip connection conductor are bonded through a bonding metal with a melting point lower than 200° C.

5. The multi-chip package of claim 2, further comprising a first bump located between the interposer connection conductor and the chip connection conductor.

6. The multi-chip package of claim 5, further comprising a second bump located between the first bump and the chip connection conductor.

7. The multi-chip package according to claim 2, further comprising:
   a passivation layer disposed between the interposer and the plurality of semiconductor chips and encapsulating the interposer connection conductor and the chip connection conductor.

8. The multi-chip package of claim 2, wherein the interposer connection conductor comprises a first interposer connection conductor having a first width in a first direction parallel to the second surface of the interposer and a second interposer connection conductor having a second width in the first direction, and the first width is greater than the second width.

9. The multi-chip package of claim 8, wherein the chip connection conductor comprises a first chip connection conductor having a third width in the first direction and a second chip connection conductor having a fourth width in the first direction, and the third width is greater than the fourth width.

10. The multi-chip package of claim 9, wherein the first interposer connection conductor and the first chip connection conductor are bonded to each other, and the second interposer connection conductor and the second chip connection conductor are bonded to each other.

11. The multi-chip package according to claim 1, wherein the interposer comprises an opening exposing at least a portion of the wiring structure; and the interposer via is disposed in the opening.

12. The multi-chip package according to claim 11, wherein a width of the opening increases as a distance from the plurality of semiconductor chips increases.

13. The multi-chip package according to claim 11, wherein the redistribution circuit structure comprises a dielectric layer and a redistribution circuit layer, and the redistribution circuit layer is electrically connected to the interposer via.

14. The multi-chip package according to claim 13, wherein a portion of the dielectric layer fills a portion of the opening.

15. The multi-chip package of claim 1, wherein a sidewall of the encapsulant, a sidewall of the interposer and a sidewall of the redistribution circuit structure are aligned to each other.

16. The multi-chip package according to claim 1, wherein the interposer includes a through silicon via.

17. The multi-chip package according to claim 1, wherein a material of a body of the interposer includes silicon, germanium, gallium arsenide (GaAs) or glass.

18. The multi-chip package according to claim 1, further comprising:
   an underfill disposed between the interposer and the plurality of semiconductor chips, wherein a width of the underfill increases as a distance from the plurality of semiconductor chips increases.

19. A multi-chip package, comprising:
   an interposer comprising a wiring structure, an opening exposing at least a portion of the wiring structure, and an interposer via disposed in the opening and electrically connected to the wiring structure;
   a plurality of semiconductor chips disposed on a first surface of the interposer and electrically connected to each other through the interposer; and
   a redistribution circuit structure disposed on a second surface of the interposer opposite to the first surface of the interposer and connected to the interposer via,
   wherein the plurality of semiconductor chips are electrically connected to the redistribution circuit structure at least through the interposer.

20. A manufacturing method of a multi-chip package, comprising:
   providing a plurality of semiconductor chips on a first surface of an interposer such that an interposer connection conductor on the interposer and a chip connection conductor on the plurality of semiconductor chips are bonded to each other;

forming an opening in a second surface of the interposer opposite to the first surface of the interposer to expose at least a portion of a wiring structure within the interposer;

forming an interposer via in the opening, wherein the interposer via is connected to the wiring structure; and forming a redistribution circuit structure on the second surface of the interposer, wherein the redistribution circuit structure is electrically connected to the interposer via.

* * * * *